United States Patent
Goto et al.

(10) Patent No.: US 12,301,201 B2
(45) Date of Patent: May 13, 2025

(54) ACOUSTIC WAVE ELEMENT HAVING HIGH ACOUSTIC VELOCITY LAYER

(71) Applicant: Skyworks Solutions, Inc., Woburn, MA (US)

(72) Inventors: Rei Goto, Osaka (JP); Siarhei Dmitrievich Barsukou, Takarazuka (JP)

(73) Assignee: Skyworks Solutions, Inc., Irvine, CA (US)

( * ) Notice: Subject to any disclaimer, the term of this patent is extended or adjusted under 35 U.S.C. 154(b) by 1209 days.

(21) Appl. No.: 17/033,336

(22) Filed: Sep. 25, 2020

(65) Prior Publication Data

US 2021/0099152 A1    Apr. 1, 2021

Related U.S. Application Data

(60) Provisional application No. 62/907,023, filed on Sep. 27, 2019, provisional application No. 62/907,021, filed on Sep. 27, 2019.

(51) Int. Cl.
*H03H 9/02* (2006.01)
*H03H 9/13* (2006.01)
*H03H 9/56* (2006.01)

(52) U.S. Cl.
CPC .......... *H03H 9/02031* (2013.01); *H03H 9/13* (2013.01); *H03H 9/564* (2013.01)

(58) Field of Classification Search
CPC .............................. H03H 9/02031; H03H 9/13
See application file for complete search history.

(56) References Cited

U.S. PATENT DOCUMENTS

| | | | |
|---|---|---|---|
| 6,642,813 B1* | 11/2003 | Itakura | H03H 9/02582 333/150 |
| 2010/0038993 A1* | 2/2010 | Umeda | H03H 9/02574 310/313 B |
| 2015/0326200 A1* | 11/2015 | Grannen | H03H 9/02102 310/346 |
| 2016/0065169 A1 | 3/2016 | Rinaldi et al. | |
| 2016/0182009 A1* | 6/2016 | Bhattacharjee | H03H 9/02574 310/313 R |
| 2017/0052174 A1 | 2/2017 | Branch et al. | |
| 2017/0214384 A1* | 7/2017 | Bhattacharjee | H03H 9/15 |

(Continued)

OTHER PUBLICATIONS

Nakahata et al., "Theoretical Study on SAW Characteristics of Layered Structures Including a Diamond Layer", IEEE Transactions on Ultrasonics, Ferroelectrics, and Frequency Control, 42(2):362-375, (May 1995).

(Continued)

*Primary Examiner* — Bryan P Gordon
(74) *Attorney, Agent, or Firm* — Knobbe, Martens, Olson & Bear, LLP

(57) ABSTRACT

An acoustic wave element is disclosed. The acoustic wave element can include a piezoelectric layer that includes aluminum nitride. The acoustic wave element can also include a diamond like carbon layer. The acoustic wave element can further include an interdigital transducer electrode that is positioned on the piezoelectric layer. The piezoelectric layer is positioned between the interdigital transducer electrode and the diamond like carbon layer. The acoustic wave element is configured to generate a Lamb wave having a wavelength of $\lambda$.

20 Claims, 14 Drawing Sheets

(56) References Cited

U.S. PATENT DOCUMENTS

| | | | |
|---|---|---|---|
| 2017/0214385 A1* | 7/2017 | Bhattacharjee | H03H 3/0072 |
| 2018/0219525 A1 | 8/2018 | Chen | |
| 2019/0181830 A1* | 6/2019 | Xu | H03H 9/175 |
| 2019/0222194 A1* | 7/2019 | Nakagawa | H03H 9/1085 |
| 2020/0259480 A1* | 8/2020 | Pensala | H03H 9/13 |
| 2020/0304094 A1* | 9/2020 | Nagatomo | H03H 9/02062 |
| 2021/0099152 A1* | 4/2021 | Goto | H03H 9/02015 |
| 2021/0111694 A1 | 4/2021 | Goto et al. | |

OTHER PUBLICATIONS

Qamar et al., "Solidly Mounted Anti-Symmetric Lamb-Wave Delay Lines as an Alternate to SAW Devices", Electron Device Letters, pp. 1-4, (Oct. 2018).

Wang et al., "Enhanced performance of 17.7 GHz SAW devices based on AlN/diamond/Si layered structure with embedded nanotransducer", Applied Physics Letters 111, pp. 253502-1-253502-5, (Dec. 2017).

Zou et al., The Multi-Mode Resonance in AlN Lamb Wave Resonators, Journal of Microelectromechanical Systems, pp. 1-12, (Sep. 2018).

\* cited by examiner

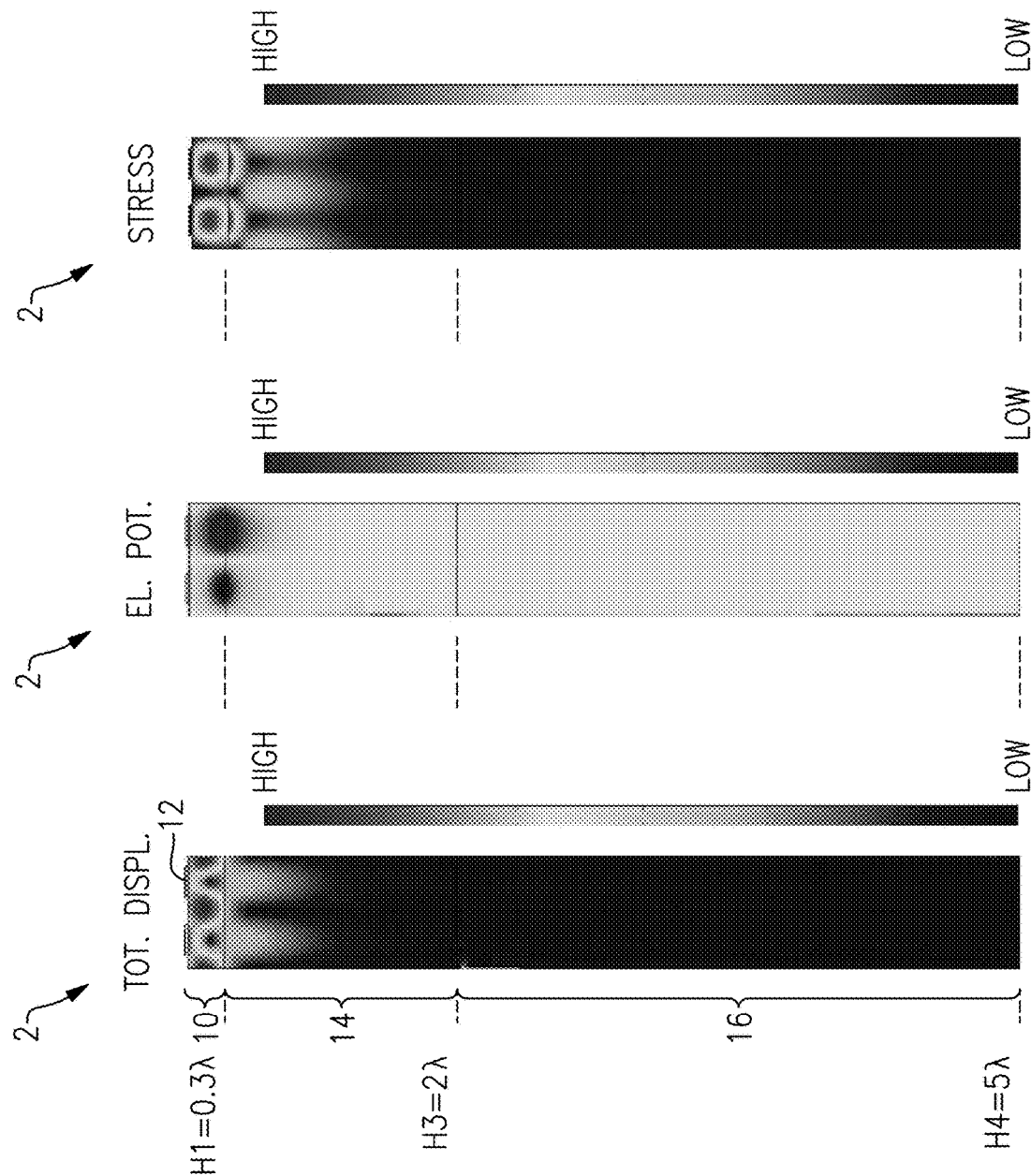

ACOUSTIC WAVE ELEMENT HAVING HIGH ACOUSTIC VELOCITY LAYER

CROSS REFERENCE TO PRIORITY APPLICATION

This application claims the benefit of priority of U.S. Provisional Patent Application No. 62/907,023, filed Sep. 27, 2019 and titled "ACOUSTIC WAVE RESONATOR WITH SPINEL SUBSTRATE," and U.S. Provisional Patent Application No. 62/907,021, filed Sep. 27, 2019 and titled "LAMB WAVE DELAY LINE ALUMINUM NITRIDE PIEZOELECTRIC LAYER," the disclosures of which are hereby incorporated by reference in its entirety herein.

BACKGROUND

Technical Field

Embodiments of this disclosure relate to acoustic wave elements.

Description of Related Technology

Acoustic wave devices such as delay lines and acoustic wave resonators can be implemented in radio frequency electronic systems. For instance, a radio frequency front end of a mobile phone can include one or more delay lines and/or one or more acoustic wave filters that includes an acoustic wave resonator. A plurality of acoustic wave filters can be arranged as a multiplexer.

A delay line can include sets of interdigital transducer electrodes on a piezoelectric substrate. Example delay lines include Lamb wave delay lines and Rayleigh delay lines.

An acoustic wave filter can include a plurality of resonators arranged to filter a radio frequency signal. Example acoustic wave filters include surface acoustic wave (SAW) filters, bulk acoustic wave (BAW) filters, and Lamb wave filters. Example BAW resonators include film bulk acoustic wave resonators (FBARs) and solidly mounted resonators (SMRs). In BAW filters, acoustic waves propagate in a bulk of a piezoelectric layer. A SAW filter can include an interdigital transductor electrode on a piezoelectric substrate and can generate a surface acoustic wave on a surface of the piezoelectric layer on which the interdigital transducer electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave element is disclosed. The acoustic wave element can include a piezoelectric layer that includes aluminum nitride. The acoustic wave element can also include a diamond like carbon layer, and an interdigital transducer electrode positioned on the piezoelectric layer. The piezoelectric layer can be positioned between the interdigital transducer electrode and the diamond like carbon layer. The acoustic wave element can be configured to generate a Lamb wave having a wavelength of $\lambda$.

In an embodiment, the Lamb wave is a lowest-order antisymmetric mode Lamb.

In an embodiment, the acoustic wave element further includes a support layer under the diamond like carbon layer. The support layer can be a silicon layer. The silicon layer can have a thickness that is greater than $200\lambda$. The support layer can include at least one of silicon dioxide, a ceramic, or sapphire.

In an embodiment, the piezoelectric layer is a doped aluminum nitride layer. The piezoelectric layer can be doped with scandium.

In an embodiment, the interdigital transducer electrode is an aluminum electrode.

In an embodiment, the piezoelectric layer is a thickness in a range from $0.1\lambda$ to $1\lambda$.

In an embodiment, the diamond like carbon layer has a thickness in a range from 2 The diamond like carbon layer can have the thickness in a range from $2\lambda$ to $10\lambda$.

In an embodiment, the acoustic wave element is a Lamb wave resonator.

In an embodiment, the acoustic wave element is included in a Lamb wave delay line.

In an embodiment, the acoustic wave element further includes a metal layer that is positioned between the piezoelectric layer and the diamond like carbon layer. The metal layer can include titanium. The metal layer can further include molybdenum. The acoustic wave element can further include a support layer under the diamond like carbon layer. The acoustic wave element can further include a silicon layer under the diamond like carbon layer.

In one aspect, an acoustic wave element configured to generate Lamb wave is disclosed. The acoustic wave element can include a piezoelectric layer that includes aluminum nitride. The acoustic wave element can also include a high acoustic velocity layer positioned under the piezoelectric layer. The high acoustic velocity layer has an acoustic velocity that is greater than an acoustic velocity of the piezoelectric layer. The acoustic wave element can further include an interdigital transducer electrode positioned over the piezoelectric layer. The acoustic wave element can be configured to generate a lowest-order anti symmetric mode Lamb wave that has a wavelength of $\lambda$.

In an embodiment, the acoustic wave element further includes a support layer positioned under the high acoustic velocity layer. The support layer can be a silicon layer. The silicon layer can have a thickness that is greater than $200\lambda$.

In an embodiment, the piezoelectric layer is a doped aluminum nitride layer. The piezoelectric layer can be doped with scandium.

In an embodiment, the high acoustic velocity layer is a diamond like carbon layer.

In an embodiment, the high acoustic velocity layer is a diamond layer.

In an embodiment, the interdigital transducer electrode is an aluminum electrode.

In an embodiment, the acoustic wave element further includes a support layer that includes at least one of silicon dioxide, a ceramic, or sapphire.

In an embodiment, the piezoelectric layer has a thickness in a range from $0.1\lambda$ to $1\lambda$.

In an embodiment, the high acoustic velocity layer has a thickness in a range from $2\lambda$ to $200\lambda$. The high acoustic velocity layer can have the thickness in a range from $2\lambda$ to $50\lambda$. The high acoustic velocity layer can have the thickness in a range from $2\lambda$ to $10\lambda$.

In an embodiment, the acoustic wave element is a Lamb wave resonator.

In an embodiment, the acoustic wave element is included in a Lamb wave delay line.

In an embodiment, the acoustic wave element further includes a metal layer positioned between the piezoelectric layer and the diamond like carbon layer. The metal layer can include titanium. The metal layer can further include molybdenum. The acoustic wave element can further include a support layer under the diamond like carbon layer. The acoustic wave element can further include a silicon layer under the diamond like carbon layer.

In one aspect, an acoustic wave element that is configured to generate Lamb wave is disclosed. The acoustic wave element can include a piezoelectric layer that has an acoustic velocity of at least 10,000 meters per second. The acoustic wave element can also include a diamond like carbon layer that is positioned under the piezoelectric layer. The acoustic wave element can further include an interdigital transducer electrode that is positioned over the piezoelectric layer. The interdigital transducer electrode is configured to generate a Lamb wave having a wavelength of $\lambda$.

In an embodiment, a delay line includes the acoustic wave element. The delay line can have an operating frequency in a range from 5 gigahertz to 12 gigahertz. The delay line can have an operating frequency in a range from 8 gigahertz to 12 gigahertz.

In an embodiments, an acoustic wave filter includes the acoustic wave element.

In one aspect, a Lamb wave delay line is disclosed. The Lamb wave delay line can include an aluminum nitride piezoelectric layer, and a first interdigital transducer electrode that is positioned over the aluminum nitride piezoelectric layer. The first interdigital transducer electrode is configured to generate a second harmonic lowest-order antisymmetric mode Lamb wave that has a wavelength of $\lambda$. The aluminum nitride piezoelectric layer can have a thickness in a range from $0.1\lambda$ to $1\lambda$. The Lamb wave delay line can also include a second interdigital transducer electrode positioned over the aluminum nitride piezoelectric layer. The second interdigital transducer electrode is coupled to the first interdigital transducer electrode. The first interdigital transducer electrode and the second interdigital transducer electrode are included in a delay line.

In an embodiment, the piezoelectric layer has a thickness in a range from $0.1\lambda$ to $0.5\lambda$. The first interdigital transducer electrode can have a thickness in a range from $0.01\lambda$ to $0.1\lambda$.

In an embodiment, the first interdigital transducer electrode has an aperture length in a range from $40\lambda$ to $60\lambda$.

In an embodiment, the aluminum nitride piezoelectric layer is a doped aluminum nitride piezoelectric layer.

In an embodiment, the doped aluminum nitride piezoelectric layer is doped with scandium.

In an embodiment, the Lamb wave delay line has an operating frequency in a range from 5 gigahertz to 12 gigahertz. The Lamb wave delay line can have an operating frequency in a range from 8 gigahertz to 12 gigahertz. The Lamb wave delay line can have an operating frequency in a range from 8 gigahertz to 10 gigahertz.

In an embodiment, the second interdigital transducer electrode is configured to generate a second harmonic lowest-order antisymmetric mode Lamb wave.

In one aspect, a Lamb wave delay line is disclosed. The lamb wave delay line can include an aluminum nitride piezoelectric layer, and two sets of interdigital transducer electrodes over the aluminum nitride piezoelectric layer. The sets of interdigital transducer electrodes includes a first interdigital transducer electrode and a second interdigital transducer electrode. The first interdigital transducer electrode is configured to generate a second harmonic lowest-order antisymmetric mode Lamb wave having a wavelength of $\lambda$. The piezoelectric layer has a thickness in a range from $0.1\lambda$ to $1\lambda$. The first interdigital transducer electrode and the second interdigital transducer electrode are included in a delay line. The delay line has an operating frequency in a range from 5 gigahertz to 12 gigahertz.

In an embodiment, the piezoelectric layer has a thickness in a range from $0.1\lambda$ to $0.5\lambda$. The first interdigital transducer electrode has a thickness in a range from $0.01\lambda$ to $0.1\lambda$.

In an embodiment, the first interdigital transducer electrode has an aperture length in a range from $40\lambda$ to $60\lambda$.

In an embodiment, the aluminum nitride piezoelectric layer is a doped aluminum nitride piezoelectric layer. The doped aluminum nitride piezoelectric layer can be doped with scandium.

In an embodiment, the delay line matches a delay of a supply voltage to a corresponding delay arising from a phase difference between a radio frequency input signal processed by a carrier branch and a radio frequency input signal processed by a peaking branch.

In an embodiment, the delay line has an operating frequency in a range from 8 gigahertz to 12 gigahertz. The delay line can have an operating frequency in a range from 8 gigahertz to 10 gigahertz.

In one aspect, a method of operating the Lamb wave delay line described herein. The method can include receiving, by the Lamb wave delay line, a radio frequency signal, and providing, by the Lamb wave delay line, a delay for the radio frequency signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 3A illustrates simulated total displacement profile of the acoustic wave element of FIG. 2A at a resonance condition.

FIG. 3B illustrates simulated electric potential of the acoustic wave element of FIG. 2A at the resonance condition.

FIG. 3C illustrates simulated stress of the acoustic wave element of FIG. 2A at the resonance condition.

DETAILED DESCRIPTION OF CERTAIN EMBODIMENTS

Figures 1A, 1B:
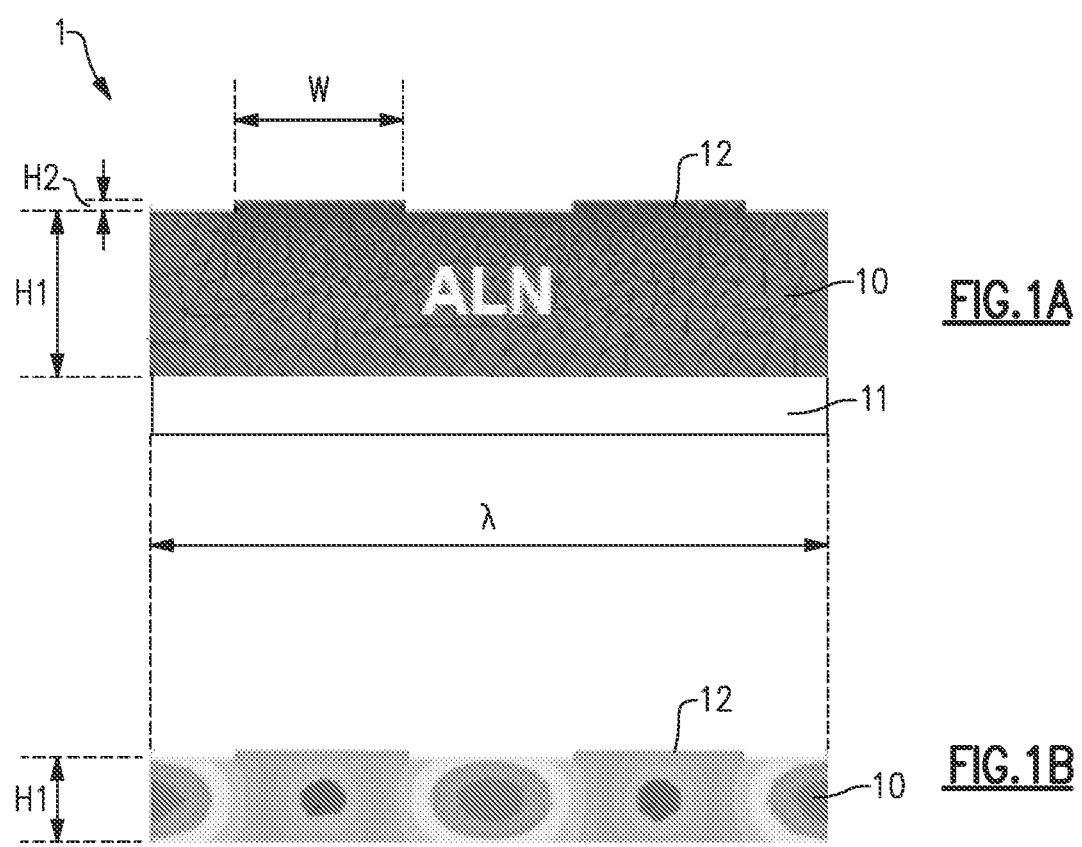
FIG. 1A illustrates a cross section of an acoustic wave element according to an embodiment.
FIG. 1B illustrates a displacement profile of the acoustic wave element of FIG. 1A.

The following description of certain embodiments presents various descriptions of specific embodiments. However, the innovations described herein can be embodied in a multitude of different ways, for example, as defined and covered by the claims. In this description, reference is made to the drawings, where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave elements can include acoustic wave resonators and acoustic wave delayer lines. Example acoustic wave elements disclosed herein include Lamb wave delay lines and Lamb wave resonators. A Lamb wave delay line can include two sets of interdigital transducers. A delay line can be used to provide a delay for a radio frequency (RF) signal. The delay line can provide phase rotation. Delay lines can be implemented in a variety of radio frequency applications. For example, delay lines can be used in a loop circuit coupled to the acoustic wave filter, in which the loop circuit is configured to generate an anti-phase signal to a target signal at a particular frequency. In some instances, a delay line can be implemented to reduce phase spreading.

Acoustic wave filters can filter radio frequency (RF) signals in a variety of applications, such as in an RF front end of a mobile phone. An acoustic wave filter can include Lamb wave resonators. A Lamb wave resonator can generate a Lamb wave.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Aspects of this disclosure relate to an acoustic wave element that provides high frequency ability. Various embodiments disclosed herein can provide high frequency ability for lowest-order antisymmetric mode Lamb waves. Various embodiments disclosed herein can provide improved structural ruggedness for an acoustic wave element operable at a relatively high frequency, while maintaining a relatively high quality factor (Q) and a large effective electromechanical coupling coefficient ($k^2$).

Embodiments of an acoustic wave element disclosed herein include a piezoelectric layer (e.g., an aluminum nitride (AlN) piezoelectric layer), and an interdigital transducer (IDT) electrode over the AlN piezoelectric layer. The acoustic wave element can also include a diamond like carbon (DLC) layer under the AlN piezoelectric layer, and a support layer (e.g., silicon (Si) layer) under the DLC layer. The acoustic wave element can further include a metal layer between the DLC layer and the AlN piezoelectric layer. In some applications, the IDT electrode can generate a second harmonic lowest-order antisymmetric mode Lamb wave having a wavelength of λ. A second harmonic lowest-order antisymmetric mode Lamb wave can be a largest resonance mode in such a device and/or have a relatively small dispersion under a substrate. Lamb wave elements disclosed herein can have relatively high resonant frequencies, such as resonant frequencies in a range from about 5 gigahertz (GHz) to 10 GHz.

Embodiments of this disclosure relate to a Lamb wave delay line that includes an aluminum nitride piezoelectric layer and interdigital transducer electrodes. The Lamb wave delay line can generate a second harmonic lowest-order antisymmetric mode Lamb wave having a wavelength of λ. A second harmonic lowest-order antisymmetric mode Lamb wave can be a largest resonance mode in such a device. The aluminum nitride piezoelectric layer can have a thickness in a range from 0.1λ to 1λ. In some embodiments, the thickness of the aluminum nitride piezoelectric layer can be less than 1 micron. The Lamb wave delay lines can have a relatively high operating frequency, such as an operating frequency in a range from 5 GHz to 10 GHz.

FIG. 1A illustrates a cross section of an acoustic wave element 1 according to an embodiment. The acoustic wave element 1 includes an aluminum nitride (AlN) piezoelectric layer 10 and an interdigital transducer (IDT) electrode 12 over the AlN piezoelectric layer 10. The acoustic wave element 1 can be arranged to generate a second harmonic lowest order antisymmetric mode Lamb wave having a wavelength. The material of the AlN piezoelectric layer 10 and a thickness H1 of the AlN piezoelectric layer 10 are technical features that contribute to the acoustic wave element 1 being arranged to generate such a Lamb wave. In some embodiments, the AlN piezoelectric layer 10 can be formed by way of deposition. In some embodiments, the acoustic wave element 1 can include a cavity (e.g., an air cavity 11) below the AlN piezoelectric layer 10.

The AlN piezoelectric layer 10 can be replaced with any suitable piezoelectric layer. For example, the AlN piezoelectric layer 10 can be replaced with any suitable electromechanical exchange material. The piezoelectric layer can include any suitable material that has an acoustic velocity of 10,000 meters per second (m/s) or greater, for example. In some embodiments, the AlN piezoelectric layer 10 can be doped with, for example, scandium (Sc).

A thickness H1 of the AlN piezoelectric layer 10 can be selected based on a wavelength λ or L of an acoustic wave generated by the acoustic wave element 1. The IDT electrode 12 has a pitch that sets the wavelength λ or L of the acoustic wave element 1. The AlN piezoelectric layer 10 can be sufficiently thick to avoid significant frequency variation. In some embodiments, the thickness H1 of the AlN piezoelectric layer can be in a range from 0.1λ to 1λ. In some instances, the thickness H1 can be in a range from 0.1λ to 0.5λ. The thickness H1 of the AlN piezoelectric layer 10 can be determined based at least in part on, for example, the mode of the operation frequency. For example, when the wavelength λ is 2 µm, the thickness H1 of the AlN piezoelectric layer 10 can be in a range from 0.2 µm to 2 µm.

The IDT electrode 12 can include a bus bar and fingers that extend from the bus bar. The fingers of the IDT electrode 12 have an active region. The active region can a region between edge portions of the fingers and gap portions. This region can be referred to as an aperture. The IDT electrode 12 can include any suitable number of fingers. For example, in some applications, the IDT electrode 12 can include about 50 fingers. In some embodiments, the aperture of the IDT electrode can be in a range from 40λ to 60λ, for example, about 50λ.

The IDT electrode 12 can include any suitable IDT electrode material. In some embodiments, the IDT electrode 12 can include an aluminum (Al) IDT electrode. The IDT electrode 12 illustrated in FIG. 1A is a single layer IDT. However, the IDT electrode 12 can include a plurality of metal layers in some instances. The IDT electrode 12 may include one or more other metals, such as copper (Cu), Magnesium (Mg), tungsten (W), titanium (Ti), the like, or any suitable combination thereof. The IDT electrode 12 may include alloys, such as AlMgCu, AlCu, etc.

The IDT electrode 12 has a thickness H2. In some embodiments, the thickness H2 of the IDT electrode 12 can be in a range from 0.01λ to 0.1λ. For example, when the wavelength λ is 2 µm, the thickness H2 of the IDT electrode 12 can be in a range from 0.02 µm to 0.2 µm.

The illustrated acoustic wave element 1 is a Lamb wave element. The Lamb wave element can be included in a delay line in some embodiments. A Lamb wave delay line can include two sets of interdigital transducers. A delay-line can be used, for example, to match a delay of a supply voltage to a corresponding delay arising from a phase difference between an RF input signal processed by a carrier branch and an RF input signal processed by the peaking branch.

In some applications, the IDT electrode 12 can be configured to generate a second harmonic Lamb wave having a wavelength of λ. The second harmonic Lamb wave can be a lowest-order antisymmetric mode Lamb wave. In some embodiments, the acoustic wave element 1 can be included in an ultra-high frequency delay line. An operating frequency of the ultra-high frequency delay line can be in a range from 3 GHz to 20 GHz in certain applications. For example, the operating frequency can be in a range from 5 GHz to 12 GHz. As another example, the operating frequency can be in a range from 8 GHz to 10 GHz. In certain applications, the operating frequency of a delay line that include the Lamb wave element 1 is about 8.5 GHz. Using the lowest order antisymmetric Lamb wave mode can be beneficial in certain embodiments. The use of the lowest order antisymmetric Lamb wave mode can allow for higher frequency operation than other modes.

FIG. 1B illustrates a displacement profile of the acoustic wave element 1 of FIG. 1A. The dashed lines between FIGS. 1A and 1B show relative positions of the AlN piezoelectric layer 10. FIG. 1B indicates that larger displacement is concentrated between the fingers of the IDT electrode 12 and a smaller displacement below the fingers of IDT electrode 12.

Figures 2A, 2B:
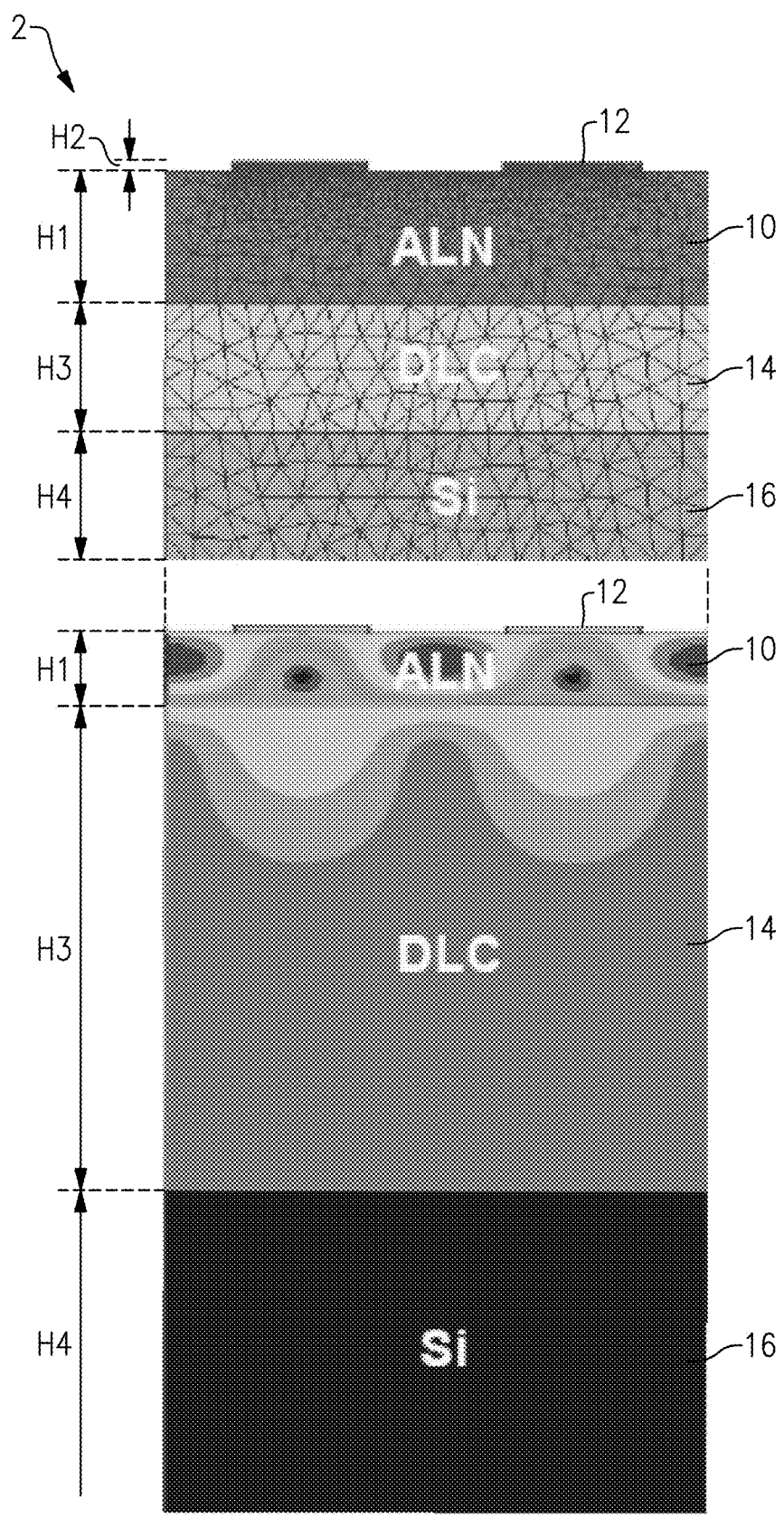
FIG. 2A illustrates a cross section of an acoustic wave element according to another embodiment.
FIG. 2B illustrates a displacement profile of the acoustic wave element of FIG. 2A.

FIG. 2A illustrates a cross section of an acoustic wave element 2 according to another embodiment. The acoustic wave element 2 includes an aluminum nitride (AlN) piezoelectric layer 10 and an interdigital transducer (IDT) electrode 12 for removing cavity over the AlN piezoelectric layer 10. The acoustic wave element 2 also includes a diamond like carbon (DLC) layer 14 under the AlN piezoelectric layer 10, and a silicon (Si) layer 16 under the DLC layer 14. The AlN piezoelectric layer 10 and the IDT electrode 12 illustrated in FIG. 2A can be generally similar or the same as the AlN piezoelectric layer 10 and the IDT electrode 12, respectively, illustrated in FIG. 1A in certain embodiments.

In the acoustic wave element 2, the AlN piezoelectric layer 10 can be replaced with any suitable piezoelectric layer. For example, the piezoelectric layer can include any suitable material that has an acoustic velocity of 10,000 m/s or greater. In some embodiments, the AlN piezoelectric layer 10 can be doped with, for example, scandium (Sc).

A thickness H1 of the AlN piezoelectric layer 10 can be selected based on a wavelength λ or L of an acoustic wave generated by the acoustic wave element 2. The IDT electrode 12 has a pitch that sets the wavelength λ or L of the acoustic wave element 2. The AlN piezoelectric layer 10 can be sufficiently thick to avoid significant frequency variation. In some embodiments, the thickness H1 of the AlN piezoelectric layer 10 can be in a range from 0.1λ to 1λ. In some instances, the thickness H1 can be in a range from 0.1λ to 0.5λ. The thickness H1 of the AlN piezoelectric layer 10 can be determined based at least in part on, for example, the mode of the operation frequency. For example, when the wavelength λ is 2 µm, the thickness H1 of the AlN piezoelectric layer 10 can be in a range from 0.2 µm to 2 µm.

The IDT electrode 12 can include a bus bar and fingers that extend from the bus bar. The fingers of the IDT electrode 12 have an active region. The active region can a region between edge portions of the fingers and gap portions. This region can be referred to as an aperture. The IDT electrode 12 can include any suitable number of fingers. For example, in some applications, the IDT electrode 12 can include about 50 fingers. In some embodiments, the aperture of the IDT electrode can be in a range from 40$\lambda$ to 60$\lambda$, for example, about 50$\lambda$.

The IDT electrode 12 can include any suitable IDT electrode material. In some embodiments, the IDT electrode 12 can include an aluminum (Al) IDT electrode. The IDT electrode 12 illustrated in FIG. 1A is a single layer IDT. However, the IDT electrodes 12 can include a plurality of metal layers in some instances. The IDT electrode 12 may include one or more other metals, such as copper (Cu), Magnesium (Mg), tungsten (W), titanium (Ti), the like, or any suitable combination thereof. The IDT electrode 12 may include alloys, such as AlMgCu, AlCu, etc.

The IDT electrode 12 has a thickness H2. In some embodiments, the thickness H2 of the IDT electrode 12 can be in a range from 0.01$\lambda$ to 0.1$\lambda$. For example, when the wavelength $\lambda$ is 2 µm, the thickness H2 of the IDT electrode 12 can be in a range from 0.02 µm to 0.2 µm.

By having a relatively high acoustic velocity material for the DLC layer 14, the DLC layer 14 can trap acoustic energy in the AlN piezoelectric layer 10, such that the quality factor (Q) can be generally maintained or unchanged as compared to an acoustic wave element without the DLC layer 14. The DLC layer 14 can be replaced with any other suitable high acoustic velocity layer. For example, the high acoustic velocity layer can include any material that has an acoustic velocity that is higher than an acoustic velocity of a piezoelectric layer (e.g., the AlN piezoelectric layer 10). In some embodiments, the high acoustic velocity layer can include any material that has an acoustic velocity greater than 10,000 m/s.

The DLC layer has a thickness H3. In some embodiments, the thickness H3 of the DLC layer 14 can be greater than about 2$\lambda$. For example, the thickness H3 of the DLC layer 14 can be in a range from 2$\lambda$ to 200$\lambda$. In some applications, the thickness H3 of the DLC layer 14 can be determined based, at least in part, on, for example, the mode of the operation frequency. In some applications, the DLC layer 14 that has the thickness H3 equal to or greater than 2$\lambda$ can have lower loss than the DLC layer 14 that has the thickness less than 2$\lambda$. In some applications, the DLC layer 14 can suppress an acoustic wave propagation in the Si layer 16. This may allow the acoustic wave element 2 to maintain high velocity, high frequency operation with improved mechanical ruggedness as compared to an acoustic wave element without the DLC layer 14.

The Si layer 16 can be replaced with any suitable support layer. In some embodiments, the support layer can include a relatively high thermal conductivity material. For example, the support layer can include a ceramic, silicon dioxide ($SiO_2$), sapphire, etc.

The Si layer 16 has a thickness H4. The thickness H4 of the Si layer 16 can be, for example, greater than 200$\lambda$. In some embodiments, the thickness H4 of the Si layer 16 can be determined based at least in part on a desired final thickness of the acoustic wave element 2.

The DLC layer 14 and the Si layer 16 can individually or in combination provide mechanical support for the AlN piezoelectric layer 10. In some embodiments, the Si layer 16 may be omitted and only the DLC layer 14 may provide support for the AlN piezoelectric layer 10. For example, a lowest order antisymmetric mode Lamb wave velocity of the acoustic wave element 2 can be about 10% higher than a similar acoustic wave element that does not include the DLC layer 14.

The acoustic wave element 2 can be an acoustic wave resonator or an acoustic wave delay line. In some applications, the acoustic wave resonator can be included in an acoustic wave filer. In some embodiments, the acoustic wave element 2 can be a Lamb wave element. The Lamb wave element can be a Lamb wave resonator in certain instances. A Lamb wave resonator is a type of acoustic wave resonator. The Lamb wave element can be a delay line in some instances. A Lamb wave delay line can include two sets of interdigital transducers. A delay-line can be used, for example, to match a delay of a supply voltage to a corresponding delay arising from a phase difference between an RF input signal processed by a carrier branch and an RF input signal processed by the peaking branch.

In some applications, the IDT electrode 12 can be configured to generate a second harmonic Lamb wave having a wavelength of $\lambda$. The second harmonic Lamb wave can be a lowest-order antisymmetric mode Lamb wave. In some embodiments, the acoustic wave element 2 can include an ultra-high frequency delay line. An operation frequency of the ultra-high frequency delay line can be in a range from 3 GHz to 20 GHz in certain applications. For example, the operating frequency can be in a range from 5 GHz to 10 GHz. As another example, the operating frequency can be in a range from 8 GHz to 10 GHz. In certain applications, the operating frequency of a delay line that includes the Lamb wave element 1 is about 8.5 GHz. Using the lowest order antisymmetric mode Lamb wave can be beneficial in certain embodiments. The use of the lowest order antisymmetric mode Lamb wave can allow for higher frequency operation than other modes.

FIG. 2B illustrates a displacement profile of the acoustic wave element 2 of FIG. 2A. The dashed lines between FIGS. 2A and 2B show relative positions of the components of the acoustic wave element 2. As with FIG. 1B, FIG. 2B indicates that larger displacement is concentrated between the fingers of the IDT electrode 12 and a smaller displacement below the fingers of the IDT electrode 12. FIG. 2B also shows that the displacement propagates through at least a portion of the DLC layer 14.

FIGS. 3A to 3C illustrate simulated total displacement profile, electric potential, and stress of the acoustic wave element 2 at a resonance condition. The simulations are based on a lowest-order antisymmetric mode Lamb wave. The acoustic wave element 2 used for the simulation includes an aluminum nitride (AlN) piezoelectric layer 10 with a thickness H1 of 0.3$\lambda$, an IDT electrode 12 formed of an aluminum (Al) IDT electrode with a thickness H2 of 0.03$\lambda$, a diamond like carbon (DLC) layer 14 with a thickness H3 of 2$\lambda$, and a silicon (Si) layer 16 with a thickness H4 of 5$\lambda$.

FIG. 3A shows that the total displacement is distributed in the AlN piezoelectric layer 10 and at an upper portion (near a boundary between the AlN piezoelectric layer 10 and the DLC layer 14) of the DLC layer 14. The total displacement is propagated through about 1$\lambda$ of the DLC layer 14 from the boundary between the AlN piezoelectric layer 10 and the DLC layer 14. At a lower portion of the DLC layer 14 opposite the upper portion, there is no notable displacement. Therefore, there is no or almost no displacement in the Si layer 16.

FIG. 3B shows that the electrical potential is concentrated at or near the boundary between the AlN piezoelectric layer 10 and the DLC layer 14. High reflection can be assumed neat the boundary in such calculation results. FIG. 3C shows that stress is propagated in the AlN piezoelectric layer 10 and at the upper portion (near the boundary between the AlN piezoelectric layer 10 and the DLC layer 14) of the DLC layer 14.

Figure 4C:
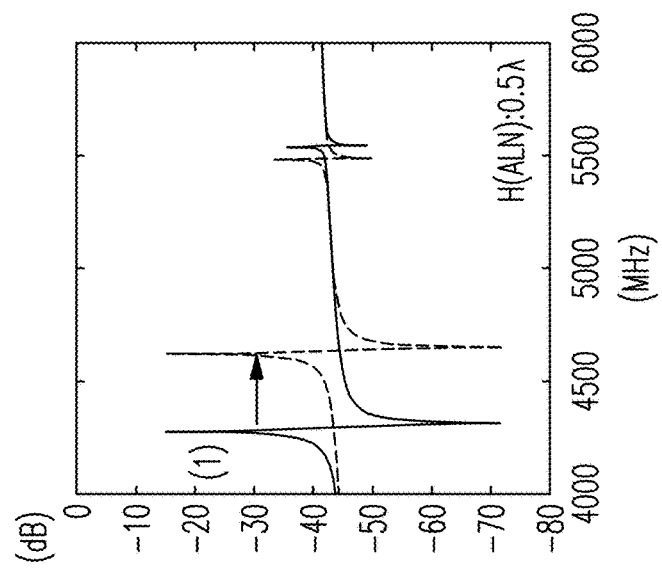
FIG. 4C illustrates simulated admittance results for the acoustic wave element of FIG. 1A and acoustic element of FIG. 2A having the AlN piezoelectric layer thickness of 0.5λ.
Figure 4B:
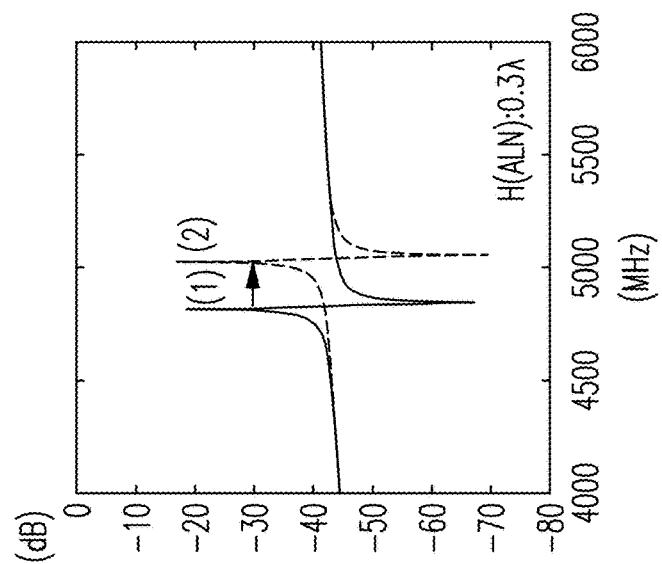
FIG. 4B illustrates simulated admittance results for the acoustic wave element of FIG. 1A and acoustic element of FIG. 2A having the AlN piezoelectric layer thickness of $0.3\lambda$.
Figure 4A:
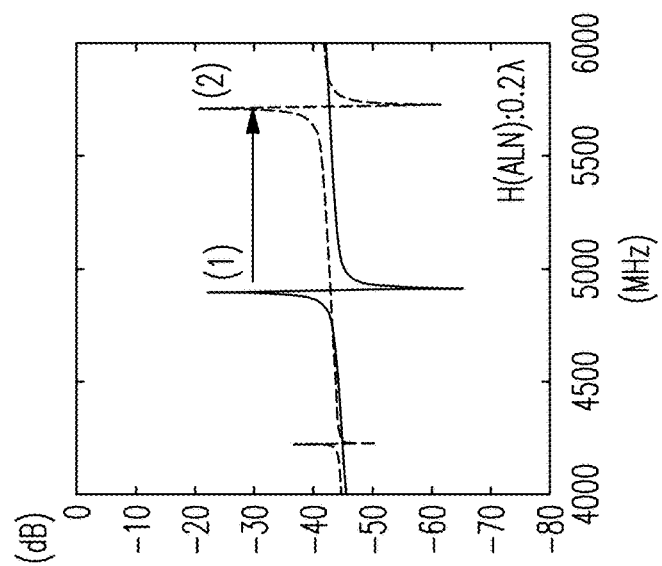
FIG. 4A illustrates simulated admittance results for the acoustic wave element of FIG. 1A and acoustic element of FIG. 2A having an aluminum nitride (AlN) piezoelectric layer thickness of $0.2\lambda$.

FIGS. 4A to 4C illustrate simulated admittance results for the acoustic wave element 1 and acoustic element 2 having various thicknesses H1 (H1=0.2λ, 0.3λ, and 0.5λ) of the AlN piezoelectric layer 10. The y-axes of FIGS. 4A to 4C show the simulated admittance in decibel (dB) and the x-axes of FIGS. 4A-4C show the frequency in megahertz (MHz). The simulation is based on a lowest-order antisymmetric mode Lamb wave.

FIG. 4A shows the simulated result (1) for the acoustic wave element 1 and the simulated result (2) for the acoustic wave element 2, when the thickness H1 of the AlN piezoelectric layer 10 is 0.2λ. The acoustic velocity of the acoustic element 2 increased about 16% relative to the acoustic velocity of the acoustic element 1. The coupling factor ($K^2$) and the quality factor (Q) of the acoustic velocity of the acoustic element 2 are observed to be generally similar to the coupling factor ($K^2$) and the quality factor (Q) of the acoustic velocity of the acoustic element 1.

FIG. 4B shows the simulated result (1) for the acoustic wave element 1 and the simulated result (2) for the acoustic wave element 2, when the thickness H1 of the AlN piezoelectric layer 10 is 0.3λ. The acoustic velocity of the acoustic element 2 increased about 5% relative to the acoustic velocity of the acoustic element 1. The coupling factor ($K^2$) and the quality factor (Q) of the acoustic velocity of the acoustic element 2 are observed to be generally similar to the coupling factor ($K^2$) and the quality factor (Q) of the acoustic velocity of the acoustic element 1.

FIG. 4C shows the simulated result (1) for the acoustic wave element 1 and the simulated result (2) for the acoustic wave element 2, when the thickness H1 of the AlN piezoelectric layer 10 is 0.5λ. The acoustic velocity of the acoustic element 2 increased about 8% relative to the acoustic velocity of the acoustic element 1. The coupling factor ($K^2$) and the quality factor (Q) of the acoustic velocity of the acoustic element 2 are observed to be generally similar to the coupling factor ($K^2$) and the quality factor (Q) of the acoustic velocity of the acoustic element 1.

Figure 5:
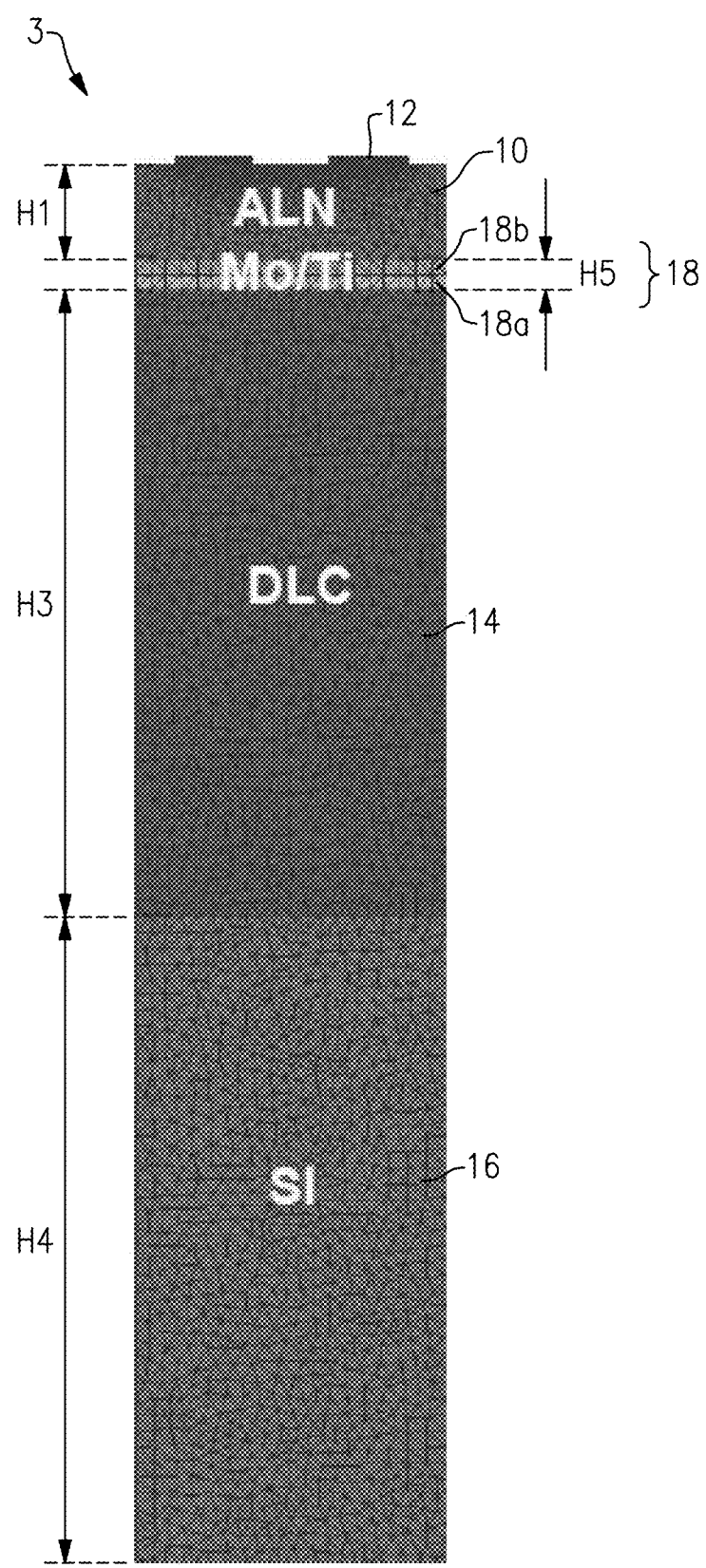
FIG. 5 illustrates a cross section of an acoustic wave element according to another embodiment.

FIG. 5 illustrates a cross section of an acoustic wave element 3 according to another embodiment. The acoustic wave element 3 includes an aluminum nitride (AlN) piezoelectric layer 10, an interdigital transducer (IDT) electrode 12 over the AlN piezoelectric layer 10, a diamond like carbon (DLC) layer 14 under the AlN piezoelectric layer 10, a silicon (Si) layer 16 under the DLC layer 14, and a metal layer 18 between the AlN piezoelectric layer 10 and the DLC layer 14. The AlN piezoelectric layer 10, the IDT electrode 12, the DLC layer 14, and the Si layer 16 illustrated in FIG. 5 can each be generally similar or the same as the AlN piezoelectric layer 10, the IDT electrode 12, the DLC layer 14, and the Si layer 16, respectively, disclosed herein with respect to other embodiments. The acoustic wave element 3 with the DLC layer 14 may exclude a cavity that may be required for a similar conventional acoustic wave element that does not have a DLC layer.

As illustrated in FIG. 5, the metal layer 18 can include a plurality of layers of different metals. For example, the metal layer 18 can include a titanium (Ti) layer 18a on the DLC layer 14 and a molybdenum (Mo) layer 18b between the Ti layer 18a and the AlN piezoelectric layer 10. In some applications, the metal layer 18 can help increase the coupling factor ($K^2$) of the acoustic wave element 3, and/or improve the quality factor (Q) of the acoustic wave element 3. This can be due to the metal layer 18 trapping charge. The Ti layer 18a can help increase the bonding strength between the metal layer 18 and the DLC layer 14. The metal layer 18 can include any suitable metal or any material with a relatively low acoustic loss. For example, the metal layer 18 can include one or more of aluminum (Al), tungsten (W), gold (Au), silver (Ag), copper (Cu), iridium (Ir) and/or the like material. In some embodiments, the metal layer 18 may not affect acoustic performance of the acoustic wave element 3. For example, the metal layer 18 can only affect electrical performance of the acoustic wave element 3.

The metal layer 18 has a thickness H5. The thickness H5 of the metal layer 18 can be less than 0.01λ. For example, the thickness H5 of the metal layer 18 can be in a range from 0.002λ to 0.01λ. For example, when the wavelength λ is 2 μm, the thickness H5 of the metal layer 18 can be in a range from 0.004 μm to 0.02 μm.

Figure 6:
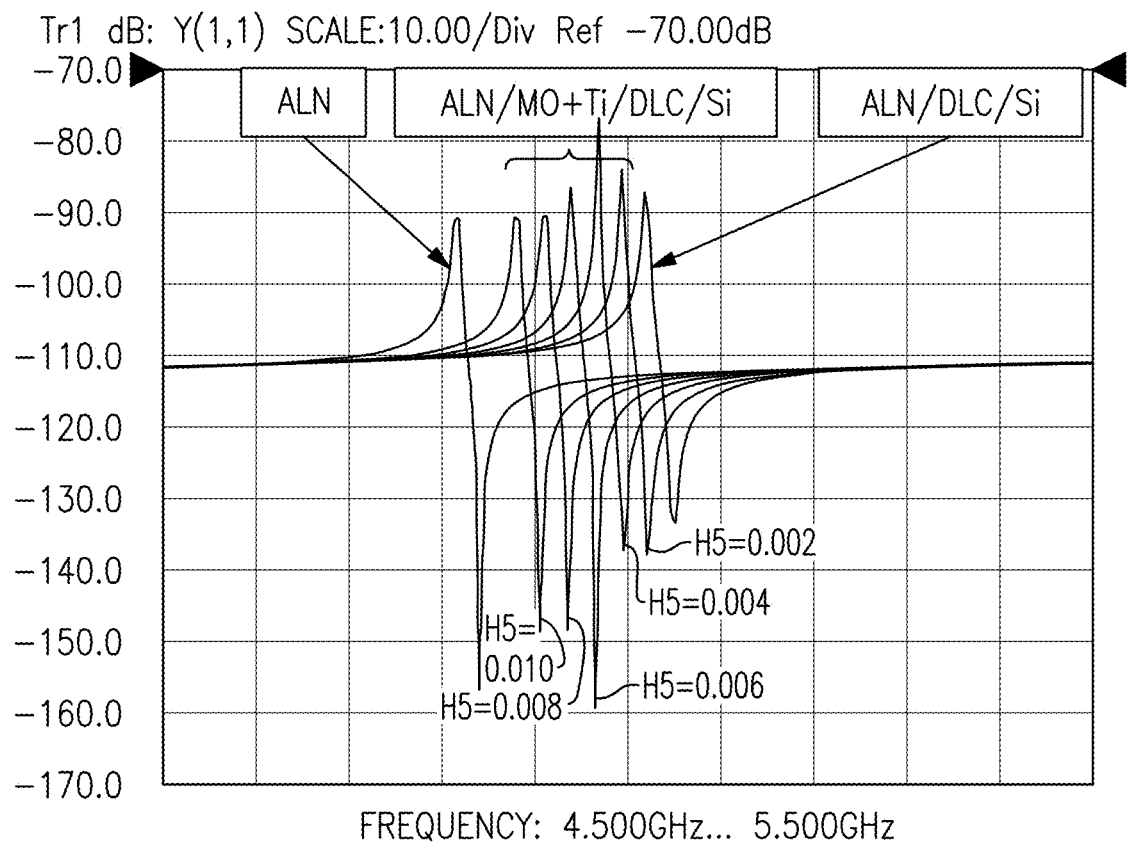
FIG. 6 is a graph showing simulation results of admittance of acoustic wave elements according to various embodiments.

FIG. 6 is a graph showing simulation results of admittance of acoustic wave elements according to various embodiments. The y-axis of FIG. 6 is for the admittance and the x-axis is for the frequency. The simulations were run for the acoustic wave element 1, the acoustic element 2, and the acoustic wave element 3. The simulation results in FIG. 6 show that the thickness H5 of the metal layer 18 of the acoustic element 3 affects the acoustic velocity. Further, when the metal layer 18 has the thickness H5 that is less than 0.01λ, the reduction in acoustic velocity is relatively small. At the same time, the coupling factor ($K^2$) is improved relative to those without the metal layer 18.

Figure 7:
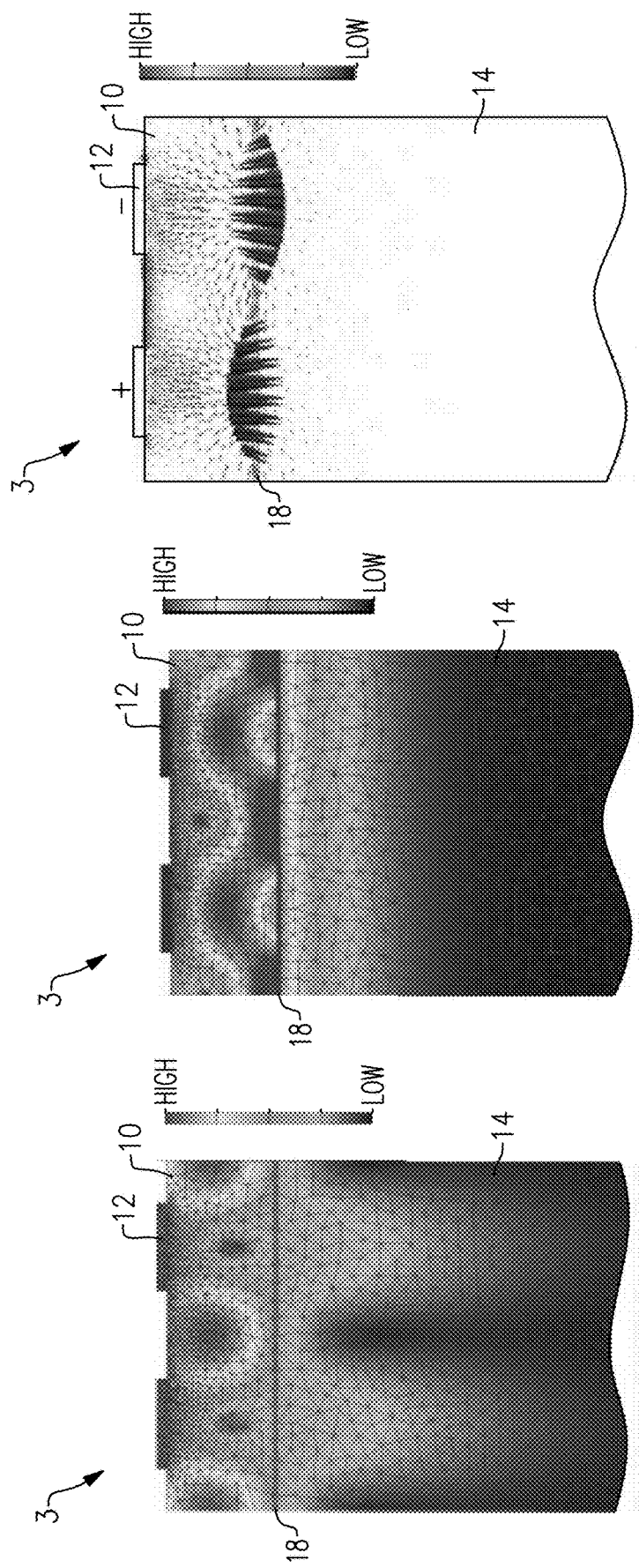
FIG. 7A illustrates simulated total displacement profile of the acoustic wave element of FIG. 5 at a resonance condition.
FIG. 7B illustrates simulated electric potential of the acoustic wave element of FIG. 5 at the resonance condition.
FIG. 7C illustrates simulated electrical filed direction of the acoustic wave element of FIG. 5 at the resonance condition.

FIGS. 7A to 7C illustrate simulated total displacement profile, electric potential, and electrical field direction of the acoustic wave element 3 at an resonance condition. The simulations are based on a lowest-order antisymmetric mode Lamb wave. The acoustic wave element 3 used for the simulation includes an aluminum nitride (AlN) piezoelectric layer 10, an IDT electrode 12, a diamond like carbon (DLC) layer 14, a silicon (Si) layer (not illustrated), and a metal layer 18 between the AlN piezoelectric layer 10 and the DLC layer 14.

FIG. 7A shows that the total displacement is distributed in the AlN piezoelectric layer 10, the metal layer 18, and at an upper portion (near a boundary between metal layer 18 and the DLC layer 14) of the DLC layer 14. The total displacement is propagated through about 1λ of the DLC layer 14 from the boundary between the metal layer 18 and the DLC layer 10. At a lower portion of the DLC layer 14 opposite the upper portion, there is no notable displacement.

FIG. 7B shows that the metal layer 18 affects the electrical potential distribution. This can allow for an increased quality factor (Q) of the acoustic wave element 3 as compared to a similar acoustic wave element without the metal layer 18. FIG. 7C shows that the electrical field is concentrated near the metal layer 18.

Figure 8:
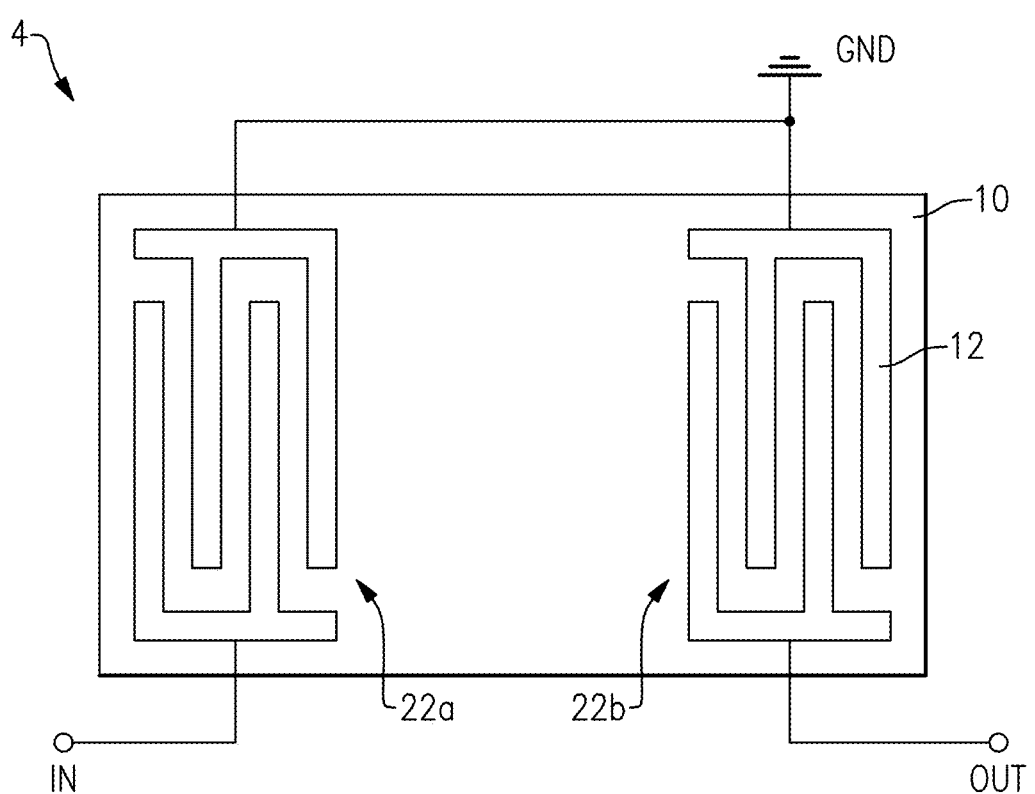
FIG. 8 illustrates a schematic top view of an acoustic wave delay line with electrical connections thereof, according to one embodiment.

FIG. 8 illustrates a schematic top view of an acoustic wave delay line 4 with electrical connections thereof, according to one embodiment. The acoustic wave delay line 4 includes an aluminum nitride (AlN) piezoelectric layer 10, and an interdigital transducer (IDT) electrode 12 over the AlN piezoelectric layer 10. The acoustic wave delay line 4 can include one or more acoustic wave elements in accordance with any suitable principles and advantages disclosed herein. As illustrated in FIG. 8, the acoustic wave delay line 4 can include two sets 22a and 22b of interdigital transducers that are longitudinally coupled to each other. A first set 22a of the two sets of interdigital transducers is spaced apart along a longitudinal direction from a second set 22b of the two sets of interdigital transducers. The first set 22a is electrically connected to an input port and the second set 22b is electrically connected to an output port. The first set 22a and the second set 22b are both electrically coupled and be grounded. The delay line 4 can include acoustic wave elements 1 in certain embodiments. The delay line 4 can include acoustic wave elements 2 in some other embodiments. The delay line 4 can have a relatively high operating frequency. The operating frequency of the delay line 4 can be in a frequency range from 3 GHz to 20 GHz in certain applications. For example, the operating frequency can be in a range from 5 GHz to 10 GHz. As another example, the operating frequency can be in a range from 8 GHz to 10 GHz. In certain applications, the operating frequency of a delay line 4 is about 8.5 GHz.

An acoustic path between the two sets 22a and 22b of interdigital transducers has a distance D. In some applications, such as in case of a single mode propagation, a delay in the acoustic wave delay line 4 can be calculated by dividing the distance D by the acoustic velocity. In some embodiments, the delay line 4 can include additional interdigital transducers positioned over the AlN piezoelectric layer 10. For example, the delay line 4 can include another pair of interdigital transducer sets coupled to the two sets 22a and 22b of interdigital transducers.

Figure 9A:
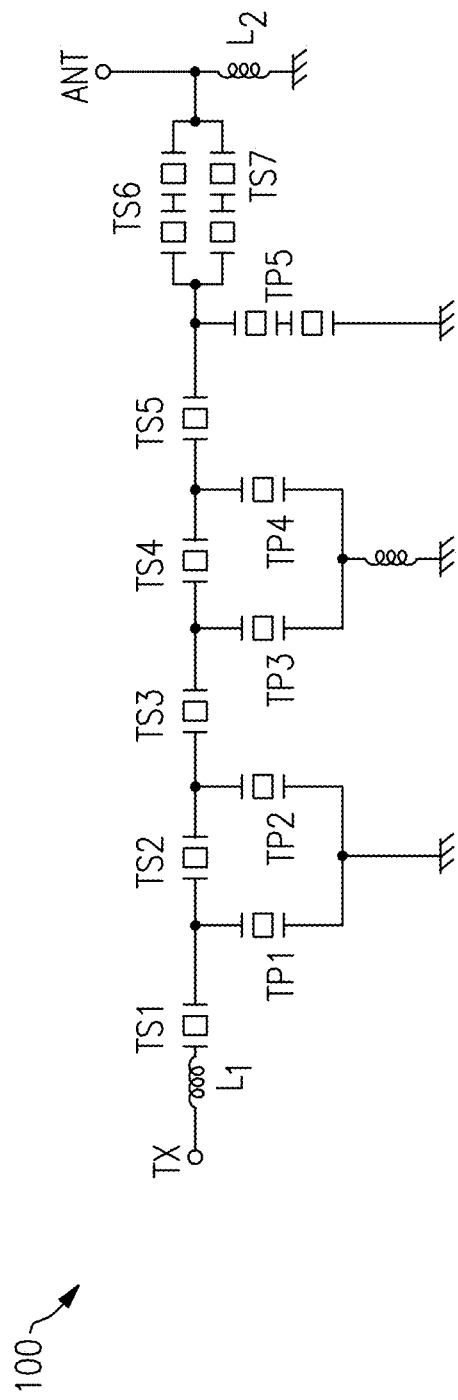
FIG. 9A is a schematic diagram of a transmit filter that includes an acoustic wave resonator according to an embodiment.

FIG. 9A is a schematic diagram of an example transmit filter 100 that includes acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the acoustic wave resonators TS1 to TS7 and/or TP1 to TP5 can be acoustic wave resonators in accordance with any suitable principles and advantages disclosed herein. For instance, one or more of the acoustic wave resonators of the transmit filter 100 can be an acoustic wave element 2 of FIG. 2A or an acoustic wave element 3 of FIG. 5. Alternatively or additionally, one or more of the acoustic wave resonators of the transmit filter 100 can be any acoustic wave element disclosed herein. Any suitable number of series acoustic wave resonators and shunt acoustic wave resonators can be included in a transmit filter 100.

Figure 9B:
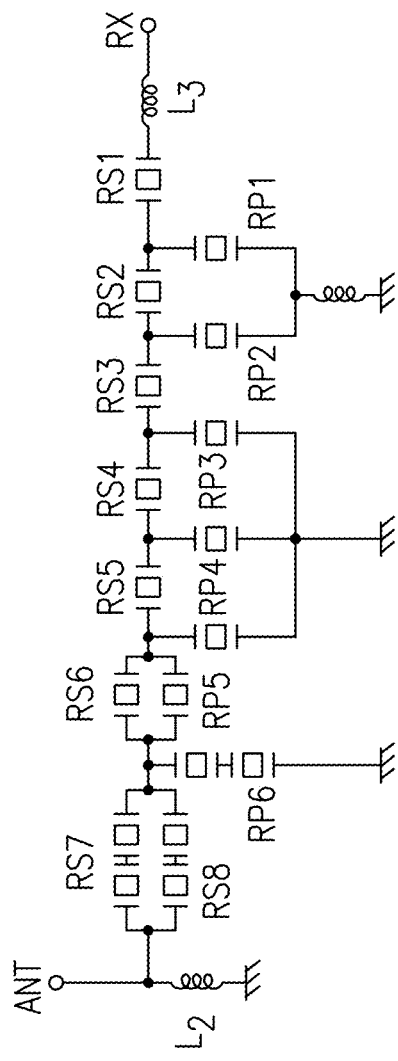
FIG. 9B is a schematic diagram of a receive filter that includes an acoustic wave resonator according to an embodiment.

FIG. 9B is a schematic diagram of a receive filter 105 that includes acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the acoustic wave resonators RS1 to RS8 and/or RP1 to RP6 can be acoustic wave resonators in accordance with any suitable principles and advantages disclosed herein. For instance, one or more of the acoustic wave resonators of the receive filter 105 can be a acoustic wave element 2 of FIG. 2A or an acoustic wave element 3 of FIG. 5. Alternatively or additionally, one or more of the acoustic wave resonators of the receive filter 105 can be any acoustic wave resonator disclosed herein. Any suitable number of series acoustic wave resonators and shunt acoustic wave resonators can be included in a receive filter 105.

Acoustic wave elements disclosed herein can be implemented in delay lines arranged to delay a radio frequency signal for a fifth generation (5G) technology application. Acoustic wave elements disclosed herein can be implemented in filters arranged to filter a radio frequency signal for a 5G technology application. Acoustic wave elements disclosed herein can operate at relatively high operating frequencies. Such acoustic wave elements can be used to delay and/or filter radio frequency signals having a frequency of at least 5 GHz that are within a 5G New Radio (NR) operating band within Frequency Range 1 (FR1). FR1 can include a frequency range from 410 megahertz (MHz) to 7.125 gigahertz (GHz), for example, as specified in a current 5G NR specification. In certain implementations, acoustic wave elements disclosed herein can delay and/or filter radio frequency signals having frequencies above FR1. According to various implementations, acoustic wave elements disclosed herein can delay and/or filter radio frequency signals having frequencies above 6 GHz, such as radio frequency signals in a frequency range from 6 GHz to 10 GHz.

Figure 10A:
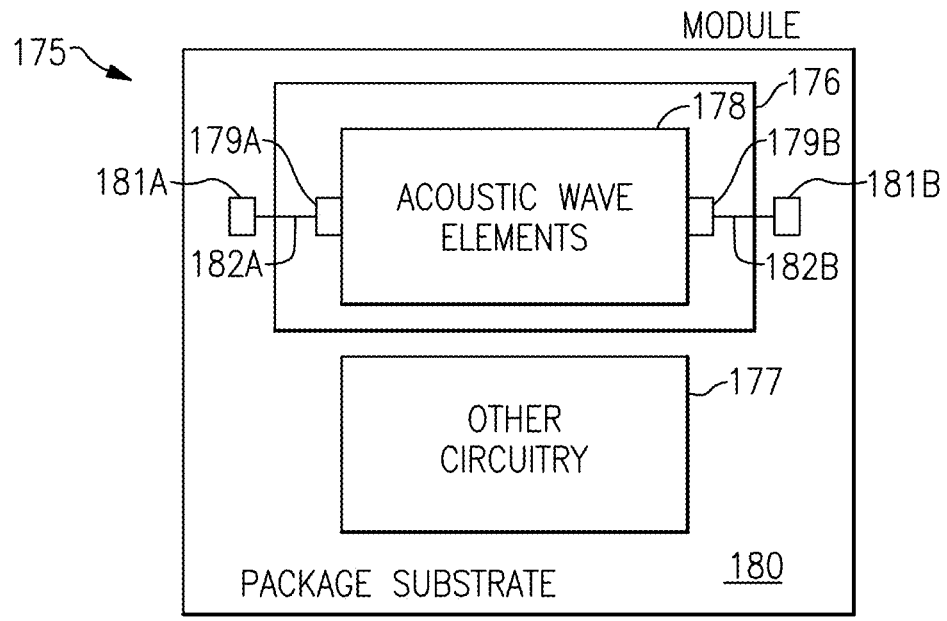
FIG. 10A is a schematic diagram of a radio frequency module that includes a Lamb wave element according to an embodiment.

FIG. 10A is a schematic diagram of a radio frequency module 175 that includes an acoustic wave component 176 according to an embodiment. The illustrated radio frequency module 175 includes the acoustic wave component 176 and other circuitry 177. The acoustic wave component 176 can include one or more acoustic wave elements with any suitable combination of features of the acoustic wave element disclosed herein. The acoustic wave component 176 can include an acoustic wave die that includes acoustic wave elements.

The acoustic wave component 176 shown in FIG. 10A can include acoustic wave elements 178 and terminals 179A and 179B. The acoustic wave elements 178 can include one or more acoustic wave elements with any suitable combination of features of the acoustic wave element disclosed herein. For example, one or more of the acoustic wave elements 178 can be an acoustic wave resonator included in an acoustic wave filter and implemented in accordance with any suitable principles and advantages of the acoustic wave element 2 of FIG. 2A and/or any acoustic wave resonators disclosed herein The acoustic wave elements 178 can implement one or more delay lines. Alternatively or additionally, the acoustic wave elements 178 can be included in one or more acoustic wave filters and/or implement one or more acoustic wave filters.

The terminals 179A and 179B can serve, for example, as an input contact and an output contact. The acoustic wave component 176 and the other circuitry 177 are on a common packaging substrate 180 in FIG. 10A. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 10B:
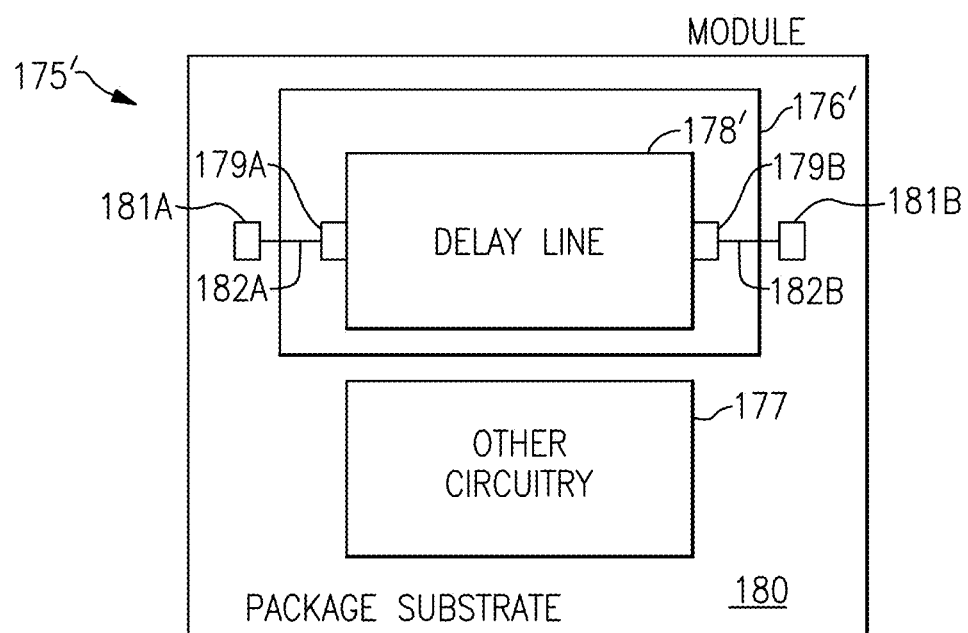
FIG. 10B is a schematic diagram of a radio frequency module that includes a delay line according to an embodiment.

FIG. 10B is a schematic diagram of a radio frequency module 175' that includes an acoustic wave component 176' according to an embodiment. The radio frequency module 175' can be generally similar to the radio frequency module 175 illustrated in FIG. 10A. The illustrated radio frequency module 175' includes the acoustic wave component 176' and other circuitry 177. The acoustic wave component 176' can include one or more acoustic wave elements with any suitable combination of features of the acoustic wave element disclosed herein. The acoustic wave component 176' can include an acoustic wave die that includes acoustic wave elements. The acoustic wave component 176' can include a delay line 178'.

Figure 11:
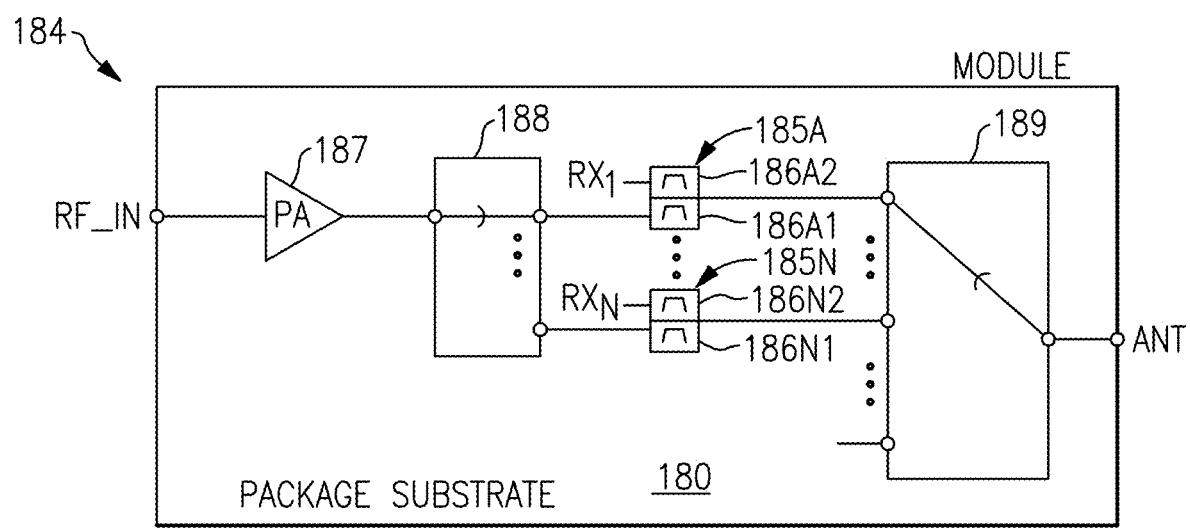
FIG. 11 is a schematic diagram of a radio frequency module that includes filters with Lamb wave resonators according to an embodiment.

FIG. 11 is a schematic diagram of a radio frequency module 184 that includes an acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more acoustic wave resonators in accordance with any suitable principles and advantages disclosed herein. Similarly, one or more of the receive filters 186A2 to 186N2 can include one or more acoustic wave resonators in accordance with any suitable principles and advantages disclosed herein. Although FIG. 11 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 12:
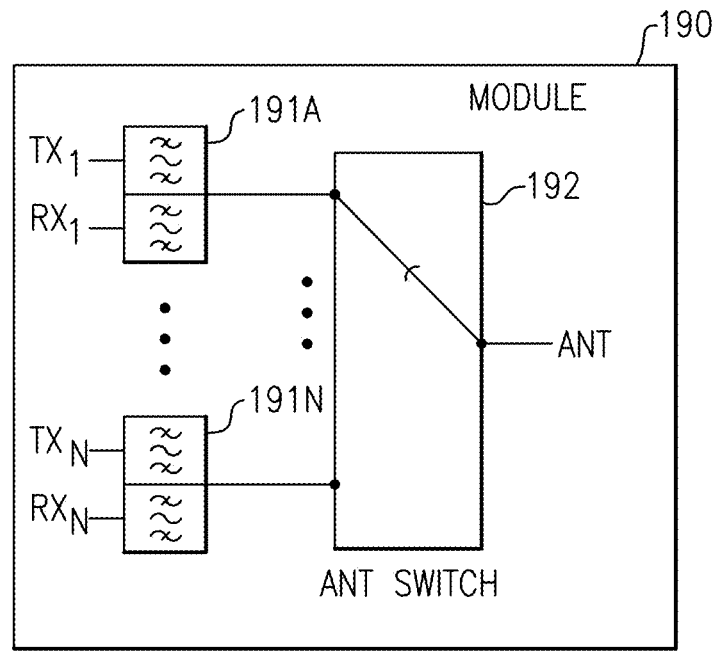
FIG. 12 is a schematic block diagram of a module that includes an antenna switch and duplexers that include a Lamb wave resonator according to an embodiment.

FIG. 12 is a schematic block diagram of a module 190 that includes duplexers 191A to 191N and an antenna switch 192. One or more filters of the duplexers 191A to 191N can include any suitable number of acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 13A:
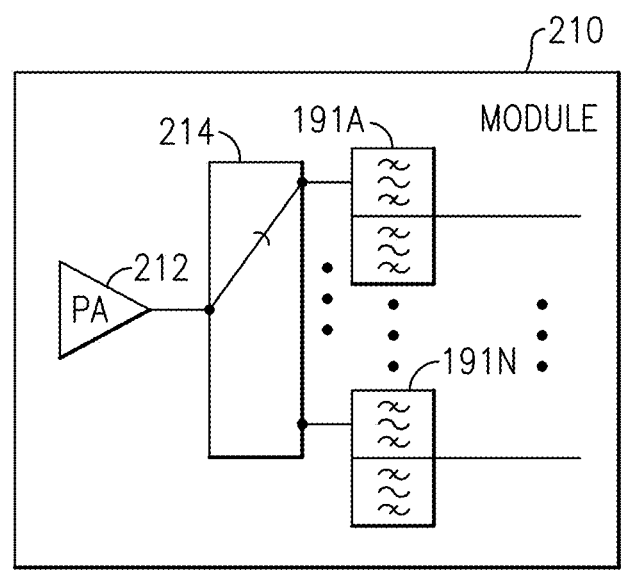
FIG. 13A is a schematic block diagram of a module that includes a power amplifier, a radio frequency switch, and duplexers that include a Lamb wave resonator according to an embodiment.

FIG. 13A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of acoustic wave resonators in accordance with any suitable principles and advantages discussed herein. Any suitable number of duplexers 191A to 191N can be implemented.

Figure 13B:
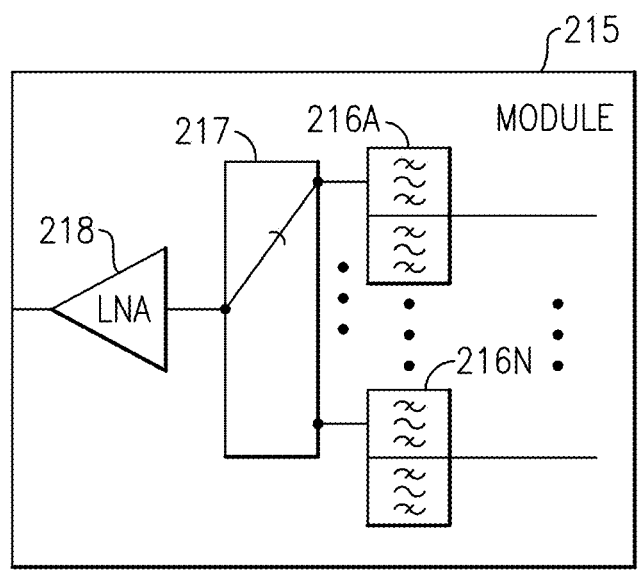
FIG. 13B is a schematic block diagram of a module that includes filters, a radio frequency switch, and a low noise amplifier according to an embodiment.

FIG. 13B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 14A:
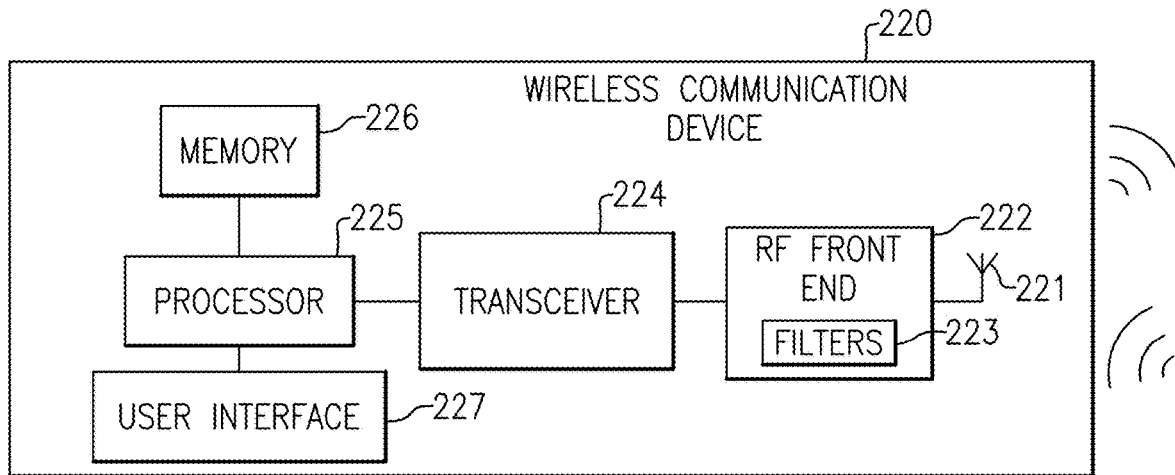
FIG. 14A is a schematic block diagram of a wireless communication device that includes a filter with a Lamb wave element in accordance with one or more embodiments.

FIG. 14A is a schematic diagram of a wireless communication device 220 that includes filters 223 in a radio frequency front end 222 according to an embodiment. The filters 223 can include one or more acoustic wave resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more delay lines, one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include one or more acoustic wave resonators that includes any suitable combination of features discussed with reference to any embodiments discussed above. Alternatively or additionally, the RF front end 222 can include one or more delay lines that include an acoustic wave element that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 14B:
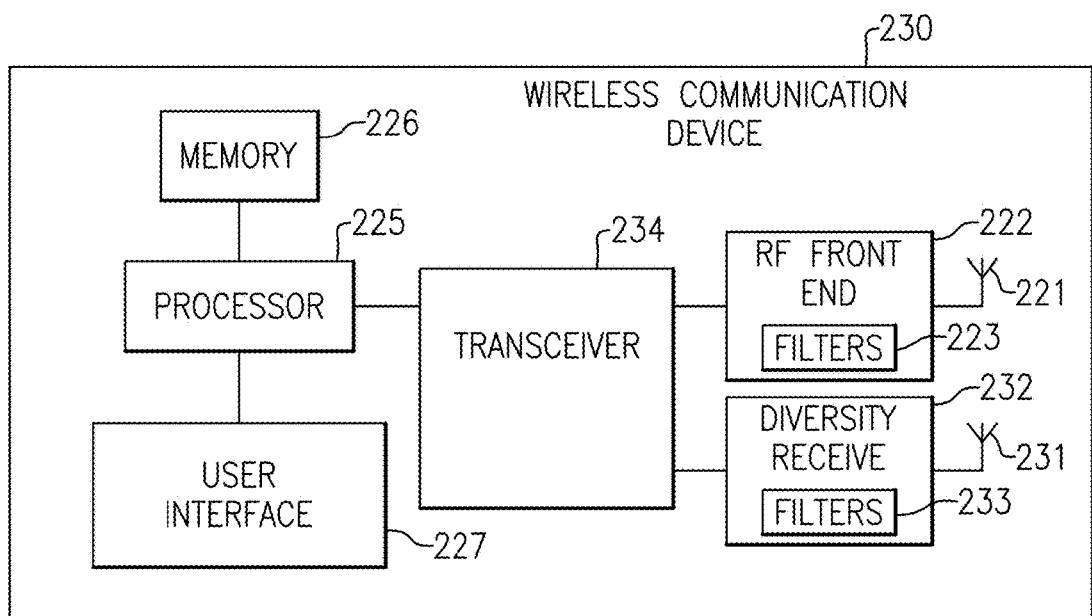
FIG. 14B is a schematic block diagram of another wireless communication device that includes a Lamb wave element in accordance with one or more embodiments.

FIG. 14B is a schematic diagram of a wireless communication device 230 that includes filters 223 in a radio frequency front end 222 and a second filter 233 in a diversity receive module 232. The wireless communication device 230 is like the wireless communication device 200 of FIG. 14A, except that the wireless communication device 230 also includes diversity receive features. As illustrated in FIG. 14B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more acoustic wave resonators that include any suitable combination of features discussed with reference to any embodiments discussed above. Alternatively or additionally, the diversity receive module 232 can include one or more delay lines that include an acoustic wave element that includes any suitable combination of features discussed with reference to any embodiments discussed above. In certain instances, the diversity receive module 232 can be considered part of a RF front end.

Any of the embodiments described above can be implemented in mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave element comprising:
a piezoelectric layer including aluminum nitride;
a diamond like carbon layer and an air cavity below the piezoelectric layer;
a first metal layer comprising titanium positioned between the diamond like carbon layer and the piezoelectric layer;
a second metal layer comprising molybdenum positioned between the first metal layer and the piezoelectric layer; and
an interdigital transducer electrode above the piezoelectric layer, that generates a Lamb wave having a wavelength of $\lambda$.

2. The acoustic wave element of claim 1 wherein the Lamb wave is a lowest-order antisymmetric mode Lamb.

3. The acoustic wave element of claim 1 further comprising a support layer under the diamond like carbon layer.

4. The acoustic wave element of claim 1 wherein the piezoelectric layer is a doped aluminum nitride layer doped with scandium.

5. The acoustic wave element of claim 1 wherein the piezoelectric layer has a thickness in a range from $0.1\lambda$ to $1\lambda$.

6. The acoustic wave element of claim 1 wherein the diamond like carbon layer has a thickness in a range from $2\lambda$ to $200\lambda$.

7. The acoustic wave element of claim 1 is included in a Lamb wave delay line.

8. The acoustic wave element of claim 7 wherein the delay line matches a first delay of a supply line to a second delay arising from a phase difference between a first radio frequency input signal processed by a carrier branch and a second radio frequency input signal processed by a peaking branch.

9. The acoustic wave element of claim 1 wherein that Lamb wave is a second harmonic Lamb wave.

10. The acoustic wave element of claim 9 wherein the second harmonic Lamb wave is a second harmonic lowest-order antisymmetric mode Lamb wave.

11. An acoustic wave element configured to generate Lamb wave, the acoustic wave element comprising:
   a piezoelectric layer including aluminum nitride;
   a high acoustic velocity layer and an air cavity under the piezoelectric layer, the high acoustic velocity layer having an acoustic velocity that is greater than an acoustic velocity of the piezoelectric layer;
   a first metal layer comprising titanium positioned between the high acoustic velocity layer and the aluminum nitride piezoelectric layer;
   a second metal layer comprising molybdenum positioned between the first metal layer and the piezoelectric layer;
   an interdigital transducer electrode over the piezoelectric layer that generates a lowest-order antisymmetric mode Lamb wave having a wavelength of $\lambda$.

12. The acoustic wave element of claim 11 further comprising a support layer under the high acoustic velocity layer, wherein the support layer is a silicon layer.

13. The acoustic wave element of claim 11 wherein the piezoelectric layer is a doped aluminum nitride layer.

14. The acoustic wave element of claim 11 wherein the high acoustic velocity layer is a diamond like carbon layer.

15. The acoustic wave element of claim 11 wherein the piezoelectric layer has a thickness in a range from $0.1\lambda$ to $1\lambda$.

16. The acoustic wave element of claim 11 wherein the high acoustic velocity layer has a thickness in a range from $2\lambda$ to $200\lambda$.

17. The acoustic wave element of claim 11 is included in a Lamb wave delay line.

18. The acoustic wave element of claim 11 wherein the lowest-order antisymmetric Lamb wave is a second harmonic lowest-order antisymmetric mode Lamb wave.

19. An acoustic wave element configured to generate Lamb wave, the acoustic wave element comprising:
   a piezoelectric layer having an acoustic velocity of at least 10,000 meters per second;
   a diamond like carbon layer and an air cavity under the piezoelectric layer;
   a first metal layer comprising titanium positioned between the diamond like carbon layer and the piezoelectric layer;
   a second metal layer comprising molybdenum positioned between the first metal layer and the piezoelectric layer; and
   an interdigital transducer electrode over the piezoelectric layer that generates a Lamb wave having a wavelength of $\lambda$.

20. A delay line comprising the acoustic wave element of claim 19 wherein the delay line has an operating frequency in a range from 5 gigahertz to 12 gigahertz.

* * * * *